(12) United States Patent
Kuroki

(10) Patent No.: US 6,849,498 B2
(45) Date of Patent: Feb. 1, 2005

(54) METHOD OF MANUFACTURING SEMICONDUCTOR CAPACITOR

(75) Inventor: Hiroki Kuroki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 325 days.

(21) Appl. No.: 10/212,878

(22) Filed: Aug. 7, 2002

(65) Prior Publication Data

US 2002/0192907 A1 Dec. 19, 2002

Related U.S. Application Data

(62) Division of application No. 09/628,350, filed on Jul. 28, 2000, now Pat. No. 6,455,917.

(30) Foreign Application Priority Data

Oct. 5, 1999 (JP) .......................................... 11-284226

(51) Int. Cl.[7] .......................................... H01L 21/8242
(52) U.S. Cl. ....................... 438/255; 438/398; 438/486; 438/657; 438/665; 438/684; 257/534
(58) Field of Search ................................ 438/255, 398, 438/396, 665, 922, 486, 657, 684; 257/534, 309, 532

(56) References Cited

U.S. PATENT DOCUMENTS

| | | | | | |
|---|---|---|---|---|---|
| 5,976,931 A | * | 11/1999 | Yew et al. | ................... | 438/255 |
| 6,048,763 A | * | 4/2000 | Doan et al. | ................. | 438/239 |
| 6,093,617 A | * | 7/2000 | Su et al. | ..................... | 438/398 |
| 6,114,214 A | * | 9/2000 | Wu | .......................... | 438/398 |
| 6,143,605 A | * | 11/2000 | Lou | ........................... | 438/255 |
| 6,174,769 B1 | * | 1/2001 | Lou | ........................... | 438/253 |
| 6,335,242 B1 | * | 1/2002 | Yamazaki | ................... | 438/255 |

* cited by examiner

*Primary Examiner*—Matthew Smith
*Assistant Examiner*—Belur V Keshavan
(74) *Attorney, Agent, or Firm*—Rabin & Berdo,P.C.

(57) ABSTRACT

Disclosed herein is a method of manufacturing a semiconductor capacitor. In the semiconductor capacitor manufacturing method, an amorphous film composed of non-doped silicon is formed. The amorphous film is changed to a lower film having projections and depressions defined in the surface thereof by heat treatment. An amorphous film composed of impurity-doped silicon is formed over the surface of the lower film. Further, the amorphous film composed of the impurity-doped silicon is changed to an upper film having projections and depressions defined in the surface thereof by heat treatment with the projections and depressions provided over the surface of the lower film as a basis. The semiconductor capacitor is equipped with an electrode having the lower film and the upper film.

8 Claims, 4 Drawing Sheets

218 ⊃ 281a, 218b, 218c, 218d, 218e, 218f $218 \supset 281a, 218b, 218c, 218d, 218e, 218f$ $218 \supset 281a, 218b, 218c, 218d, 218e, 218f$

METHOD OF MANUFACTURING SEMICONDUCTOR CAPACITOR

This application is divisional of U.S. application Ser. No. 09/628,350, filed Jul. 28, 2000 now U.S. Pat. No. 6,455,917.

BACKGROUND OF THE INVENTION

1. Field of the Invention

The present invention relates to a method of manufacturing a semiconductor capacitor and a semiconductor capacitor.

2. Description of the Related Art

In a capacitor used for a DRAM, a rough-surface polysilicon film is used as a lower electrode to thereby allow an increase in capacitor surface area and an improvement in electric capacitance. Here, rough-surface polysilicon is a polysilicon film having uneven spots or projections and depressions defined in the surface thereof. Such a structure is capable of obtaining about 2 to 2.5-times electric capacitance as compared with a structure in which a polysilicon film whose surface is flat, is used as a lower electrode.

Meanwhile, the rough-surface polysilicon film needs to have conductivity with a view toward using the rough-surface polysilicon film as the lower electrode. For example, two methods to be described below have heretofore been proposed as a method of forming the rough-surface polysilicon film having the conductivity. Incidentally, the two methods to be described below both utilizes a phenomenon in which when an amorphous film composed of silicon is crystallized, crystal grains are grown on the surface thereof by nucleation and surface migration of silicon atoms.

First of all, the first method is a method of forming a non-doped rough-surface polysilicon film and introducing an impurity into the rough-surface polysilicon film. In the first method referred to above, uneven spots or projections or depressions formed in the surface of the rough-surface polysilicon film deform due to impurity introduction such as ion injection, thermal diffusion or the like. Thus, this could lead to a reduction in the surface area of the rough-surface polysilicon film. Further, the first method will incur the risk of reducing throughput at the production of a device because the impurity introducing step is indispensable.

The second method is a method of forming an amorphous film composed of impurity-doped silicon and heat-treating the amorphous film to thereby obtain a rough-surface polysilicon film. Described more specifically, in the second method, an amorphous film composed of silicon containing an impurity necessary for conductivity is first formed by reduced pressure CVD. Afterwards, a native oxide film on the surface of the amorphous film is removed and the amorphous film is heat-treated in a pressure-reduced atmosphere. The second method described above differs from the first method in that since the introduction of the impurity into the rough-surface polysilicon film is unnecessary, projections and depressions defined in the surface of the rough-surface polysilicon film are hard to deform in form.

In the conventional second method, however, the impurity already contained in the amorphous film upon heat treatment produces a bottleneck in the migration of silicon atoms. Therefore, the forms of the projections and depressions defined in the surface of the rough-surface polysilicon film will change due to the concentration of the impurity contained in the amorphous film. Thus, if the conventional second method is applied to the formation of the rough-surface polysilicon film, then the electric capacitance of the semiconductor capacitor is not stabilized. Further, since the second method needs to remove the native oxide film and additionally effect heat treatment on the amorphous film in the pressure-reduced atmosphere, it is apt to reduce throughput at device production.

SUMMARY OF THE INVENTION

In order to solve the above-described problems, the present invention provides a method of manufacturing a semiconductor capacitor to which an electrode having a lower film and an upper film is applied, comprising: forming an amorphous film composed of non-doped silicon, changing the amorphous film to the lower film having projections and depressions defined in the surface thereof by heat treatment, forming an amorphous film composed of impurity-doped silicon over the surface of the lower film, and changing the amorphous film composed of the impurity-doped silicon to the upper film having projections and depressions defined in the surface thereof with the projections and depressions provided over the surface of the lower film as a base by heat treatment.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFFERED EMBODIMENTS

Figure 1A:
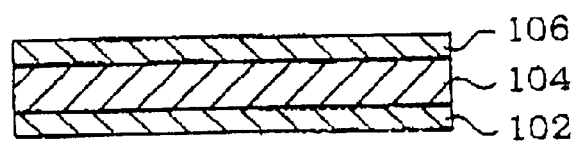
FIG. 1 is an explanatory view showing a method of manufacturing a semiconductor capacitor, to which the present invention is applicable.

Preferred embodiments of the present invention will hereinafter be described in detail with reference to the accompanying drawings. Incidentally, components each having the same function and structure in the following description and the accompanying drawings are identified by the same reference numerals, and the description of certain common elements or components will therefore be omitted.

(First Embodiment)

A first embodiment of the present invention will first be explained with reference to FIGS. 1 and 2. Incidentally, FIGS. 1 and 2 are respectively explanatory views showing a method of manufacturing a semiconductor capacitor 100, according to the present embodiment.

Figure 2A:
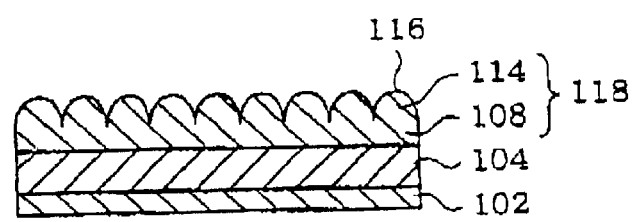
FIG. 2 is another explanatory view illustrating the method of manufacturing the semiconductor capacitor, which is shown in FIG. 1.
Figure 2B:
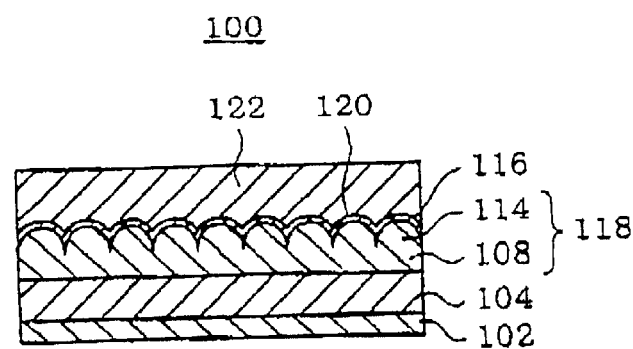

As shown in FIG. 2(b), the semiconductor capacitor 100 according to the present embodiment is formed over a silicon substrate 102 with a silicon oxide film 104 interposed therebetween. The semiconductor capacitor 100 comprises a rough-surface polysilicon film 118 used as a lower electrode, a silicon nitride film 120 used as a dielectric film, and a polysilicon film 122 used as an upper electrode.

In the present embodiment, the rough-surface polysilicon film 118 of the semiconductor capacitor 100 comprises an upper film 114 provided on the silicon nitride film 120 side and a lower film 108 provided on the silicon oxide film 104 side, as a continuous film. In such a rough-surface polysilicon film 118, projections and depressions 116 for improving the electric capacitance of the semiconductor capacitor 100 are defined in the upper film 114. In the present embodiment, projections and depressions 120 (see FIG. 2(b)), which form the basis of the formation of the projections and depressions 116, are provided over the surface of the lower film 108 before the formation of the upper film 114.

The method of manufacturing the semiconductor capacitor 100 having the structure described above includes a process for forming an insulating film, a process for forming the lower electrode, a process for forming the dielectric film, and a process for forming the upper electrode as shown in FIG. 1(a) through FIG. 2(b). The respective processes will successively be described below.

(1) Insulating Film Forming Process

In the insulating film forming process, a silicon substrate 102 is heat-treated in the presence of oxygen, and a silicon oxide film 104 is formed over the surface of the silicon substrate 102 (see FIG. 1(a)). As shown in FIG. 2(b), such a silicon oxide film 104 has the function of insulating the silicon substrate 102 and the semiconductor capacitor 100 from each other, and the function of separating the crystallizability of the silicon substrate 102 and that of the rough-surface polysilicon film 122 from each other, Incidentally, a processing temperature can be set to temperatures ranging from 800° C. to 1000° C., for example, upon the heat treatment in the present process.

(2) Lower Electrode Forming Process

In the lower electrode forming process, a rough-surface polysilicon film 118 is formed over the silicon oxide film 104 as shown in FIG. 1(a) through FIG. 2(a). In the present process, a step for forming a first amorphous film 106, which corresponds to a first step, a first vacuum heat-treating step corresponding to a second step, a step for forming a second amorphous film 112, which corresponds to a third step, and a second vacuum heat-treating step corresponding to a fourth step are executed within the same reduced pressure CVD reactor.

(2-1) Step for Forming First Amorphous Film 106

In the step for forming the first amorphous film 106, non-doped silicon is deposited over the oxide film 104 by reduced pressure CVD to thereby form the first amorphous film 106 composed of the non-doped silicon (see FIG. 1(a)). In the reduced pressure CVD in the present step, a reaction temperature is set to within a temperature range in which the non-doped silicon transitions from non-crystalline to polycrystalline.

The reaction temperature for the reduced pressure CVD in the present step may preferably be set to, for example, a temperature of from 530° C. to 580° C. if described specifically. This is because projections and depressions 116 to be described later can easily be formed in sufficient size and density by executing the reduced pressure CVD in the present step within such a temperature range. Incidentally, if the reaction temperature falls within the temperature range in which the non-doped silicon transitions from non-crystalline to polycrystalline, then the reaction temperature for the reduced pressure CVD can be also set to another temperature range in the present embodiment.

In the method of manufacturing the semiconductor capacitor, according to the present embodiment, the reaction temperature for the reduced pressure CVD in the present step, and the size and density of the projection and depressions 116 the rough-surface polysilicon film 122 have the following correlation. Namely, as the reaction temperature for the reduced pressure CVD increases, small projections and depressions 116 are formed in high density. As the reaction temperature projections and depressions 116 are formed in low density.

For example, a silane gas or a disilane gas can be used for the reduced pressure CVD in the present step. In the reduced pressure CVD in the present step, reaction time can be set to for example, 1 to 25 minutes.

(2-2) First Heat-treating Step

Figure 1B:
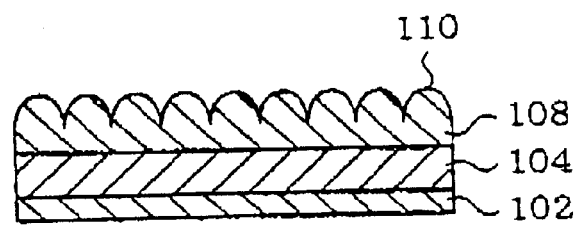
Figure 1C:
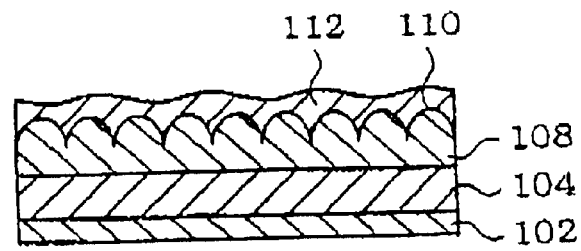

In the first heat-treating step, the first amorphous film 106 is change to a lower film 108 by a vacuum heat treatment executed so as to combine even silane-gas purge in a reactor and a change in reaction temperature therein (see FIG. 1(b)). In the present step. nucleation and migration of silicon atoms occur in the surface of the first amorphous film 106 in a process for executing the vacuum heat treatment of the first amorphous film 106 composed of the non-doped silicon. As a result a lower film 108 having projections and depressions 110 on the surface thereof are formed. Incidentally, a processing time interval can be set to for example, 20 to 30 minutes upon the heat treatment in the present step.

(2-3)Step for Forming Second Amorphous Film 112

In the forming step of the second amorphous film 112, phosphorus-doped silicon is deposited over the surface for forming the projections and depressions 110, of the lower film 108 by reduced pressure CVD to thereby form a amorphous film 112 composed of the phosphorus-doped silicon (see FIG. 2(c). The reduced pressure CVD in the present step is executed within a temperature range in which the impurity-doped silicon transitions from non-crystalline to polycrystalline.

The reaction temperature for the reduced pressure CVD in the present step may preferably be set to, for example a temperature of from 560° C. to 580° C. if described specifically. This is because owing to execution of the reduced pressure CVD in the present stop within such a temperature range, the projection and depressions 116 to be described later can be formed in sufficient size and density and the scale-up of a capacitor surface area of the semiconductor capacitor 100 can be achieved effectively.

Incidentally, in the present embodiment, the reaction temperature for the reduced pressure CVD can also be set to another temperature range if it falls within the temperature range which the phosphorus-doped silicon transitors for non-crystalline to polycrystalline. Further, when impurity-doped silicon other than the phosphorus-doped silicon is used in the manufacturing method according to the present embodiment, it is necessary to set the reaction temperature for the reduced pressure CVD in the present step to a temperature range in which the corresponding impurity-doped silicon transitions from non-crystalline to polycrystalline.

For example, a silane gas and a phosphine gas or a disilane gas and the phosphine gas can be used in the reduced pressure CVD in the present step. Further, reaction time can be set to for example, 10 to 15 minutes.

(2-4) Second Heat-treating Step

In the second heat-treating step the second amorphous film 112 is changed to an upper film 114 by a vaccum heat treatment which double as reaction gas purge in the reaction (see FIG. 2(b)). In the step, the projections and depressions 110 on the surface of the lower film 108 act in a manner similar to crystalline nuclei upon crystallization of the second amorphous film 112. Thus, the projections and depressions 116 are formed over the surface of the upper film 114 while being under the influence of the crystallizability of the lower film 108 with the projections and depressions 110 on the surface of the lower film 108 as a basis. Now, a processing time interval can be set to, for example, 20 to 30 minutes in the vacuum heat treatment in the present step.

As a result, a rough-surface polysilicon film 118 is formed which has the projections and depressions 116 formed on the surface thereof and comprises the lower film 108 and the upper film 114.

In the lower electrode forming process described above, the concentration of phosphorus in the rough-surface polysilicon film 118 less influences on the form of the rough-surface polysilicon film 118. According to the lower electrode forming process described above, the rough-surface polysilicon film 118 can be formed within the same reactor without being taken out therefrom. Further, according to the lower electrode forming process described above, the rough-surface polysilicon film 118 having conductivity can be formed without executing an impurity introducing step in particular.

(3) Dielectric Film Forming Process

In the dielectric film forming process, a silicon nitride film 120 used as an insulating film is deposited over the rough-surface polysilicon film 118 by the reduced pressure CVD (see FIG. 2(b)). For example, a dichlorosilane gas and an ammonia gas can be used in the reduced pressure CVD in the present process. Further, the silicon nitride film 120 can be deposited thereon with a thickness of say about 50 angstroms.

(4) Upper Electrode Forming Process

In the forming process of the upper electrode, the silicon nitride film 120 is oxidized in wet oxygen at about 820° C., for example. Afterwards, polysilicon is first deposited over the silicon nitride film 120 by the reduced pressure CVD. Next, an impurity is introduced therein by a predetermined impurity introducing method to thereby cause the polysilicon to have conductivity. Next, the polysilicon is subjected to patterning to thereby form a polysilicon film 122 (see FIG. 2(b)).

For example, a silane gas can be used in the reduced pressure CVD in the present process. Further, the reaction temperature for the reduced pressure CVD in the present step can be set to, for example, about 620° C. Further, various impurity introducing methods such as thermal diffusion such as vapor phase diffusion, solid phase diffusion or the like, or ion injection, etc. can be used for the impurity introduction in the present process.

In the present embodiment as described above, the process for forming the lower film having the projections and depressions defined in the surface thereof and composed of the non-doped silicon, and the process for continuously forming the upper film composed of the phosphorus-doped silicon over the lower film are executed to form the rough-surface polysilicon film which serves as the lower electrode. Namely, in the present embodiment, the upper film is formed while being under the influence of crystallizability of the lower film, whereby the rough-surface polysilicon serving as the lower electrode is formed. Thus, according to the present embodiment, the influence of the concentration of the phosphorous in the rough-surface polysilicon on the forms of the projections and depressions provided on the surface thereof becomes small and hence the capacitance of a capacitor used as an element can be stabilized.

In the present embodiment as well, the impurity introducing step for providing conductivity and the heat treating step executed after the polysilicon film has been taken out from within the reactor to thereby remove a native oxide film, become unnecessary. It is therefore possible to form a high-quality rough-surface polysilicon film free of a deposition of particles and contamination and expect an improvement in throughput as compared with the conventional manufacturing method.

The form of the phosphorous-doped polysilicon film is little affected by the concentration of phosphorous, and the polysilicon film can be formed within the same reactor without being taken out of the reactor. Since the impurity introducing step is unnecessary, the time required to manufacture a DRAM is shortened as compared with the conventional one owing to the application of the method of manufacturing the semiconductor capacitor, according to the present embodiment.

(Second Embodiment)

A second embodiment of the present invention will next be explained with reference to FIGS. 3 and 4. Incidentally, FIGS. 3 and 4 are respectively explanatory views showing a method of manufacturing a semiconductor capacitor 200, to which the present embodiment is applied.

Figure 4A:
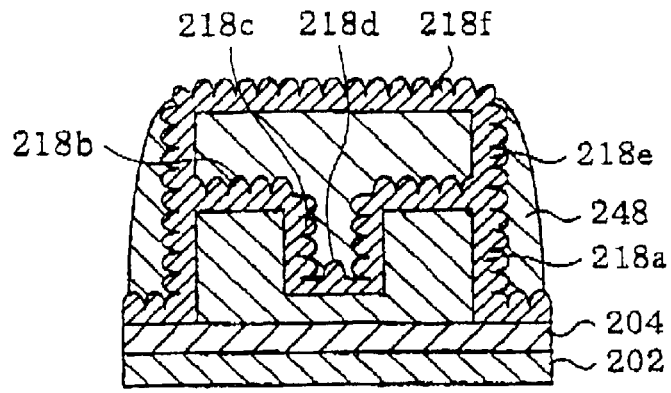
FIG. 4 is another explanatory view showing the method of manufacturing the semiconductor capacitor, which is shown in FIG. 3.
Figure 4B:
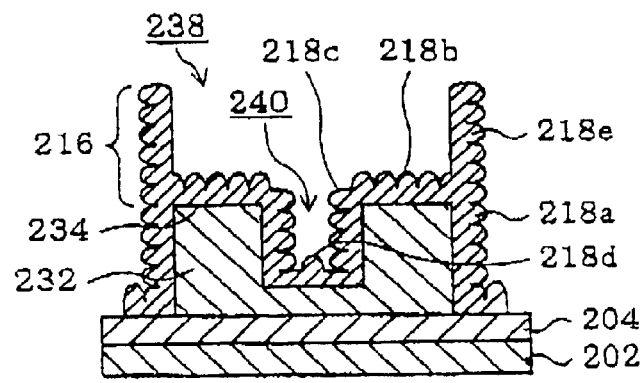
Figure 4C:
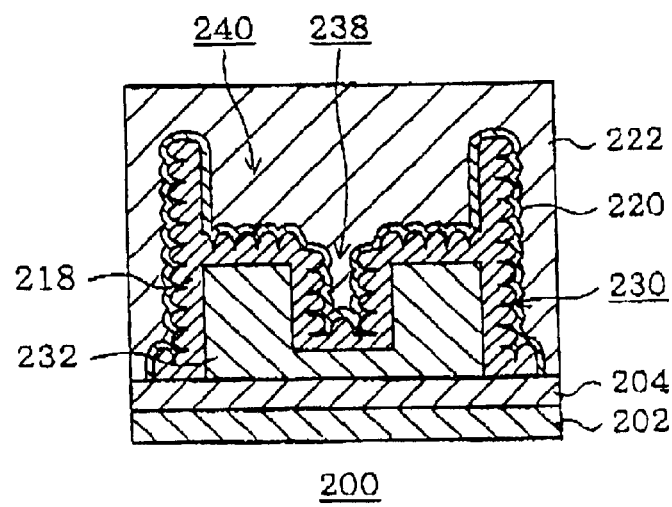

As shown in FIG. 4(c), the semiconductor capacitor 200 according to the present embodiment is formed over a silicon substrate 202 with a silicon oxide film 204 interposed therebetween. The semiconductor capacitor 200 comprises a two-stage cylinder body 230 used as a lower electrode, a silicon nitride film 220 used as a dielectric film, and a polysilicon film 222 used as an upper electrode.

As shown in FIG. 4(b), the two-stage cylinder body 230 of the semiconductor capacitor 200 comprises a conductive polysilicon film 232 which is formed over the silicon oxide film 204 and makes a base of the form of the two-stage cylinder body 230, and a rough-surface polysilicon film 218 which covers the surface of the conductive polysilicon film 232.

In the two-stage cylinder body 230, the conductive polysilicon film 232 is formed of impurity-doped silicon and has conductivity. A recess or concave portion 236 with a second cylinder portion 240 to be described later formed thereinside is defined in the conductive polysilicon film 232 at a predetermined position of an upper surface 234 corresponding to an exposed surface.

In the two-stage cylinder body 230, the rough-surface polysilicon film 218 is formed in substantially the same structure as the rough-surface polysilicon film 118 according to the first embodiment shown in FIG. 2(a) though substantially the same forming step as that for the rough-surface polysilicon film 118. Namely, the rough-surface polysilicon film 218 comprises a lower film in which an amorphous film composed of non-doped silicon is changed by heat treatment, and an upper film in which an amorphous film composed of phosphorous-doped silicon is changed by heat treatment. Irregularities or projections and depressions 216 are defined in the surface of the rough-surface polysilicon film 218.

On the other hand, the rough-surface polysilicon film 218 is shaped in a form much different from that of the rough-surface polysilicon film 118 according to the first embodiment shown in FIG. 2. Such a rough-surface polysilicon film 218 is Integrally formed of a first portion 218a, a second portion 218b, a third portion 218c, a fourth portion 218d and a fifth portion 218e as a continuous film.

Now, the first portion 218a is a portion formed over each of outer surfaces of the conductive polysilicon film 232. The second portion 218b is a portion formed over the upper surface 234 of the conductive polysilicon film 232. Further, the third portion 218c is a portion formed over an inner surface of the concave portion 236. The fourth portion 218d is a portion formed over the bottom face of the concave portion 236. Furthermore, the fifth portion 218e is a portion formed by extending or drawing the first portion 218a upwardly of the conductive polysilicon film 232 and is formed so as to project over the upper surface 234.

With the result that the conductive polysilicon film 232 and the rough-surface polysilicon film 218 have the structures described above respectively, a first cylinder portion 238 is formed above the conductive polysilicon film 232 of the two-stage cylinder body 230, and the second cylinder portion 240 is formed inside the concave portion 236 of the two-stage cylinder body 230. Accordingly, the two-stage cylinder body 230 used as the lower electrode of the semiconductor capacitor 200 has an extremely large surface area in cooperation with an improvement in the surface area due to the projections and depressions 216.

Now, the second cylinder portion 240 is opened at the bottom of the first cylinder portion 238. The inside diameter thereof is smaller than that of the first cylinder portion 238. In the first cylinder portion 238, each side wall is formed by the fifth portion 218e and the bottom is formed by the second portion 281b. In the second cylinder portion 240, each side wall is formed by the second portion 218b and the bottom is formed by the third portion.

The method of manufacturing the semiconductor capacitor 200 having the structure described above includes a process for forming an insulating film, a process for forming the lower electrode, a process for forming the dielectric film, and a process for forming the upper electrode as shown in FIG. 3(a) through FIG. 4(c). The respective processes will successively be described below.

(1) Insulating Film Forming Process

Figure 3A:
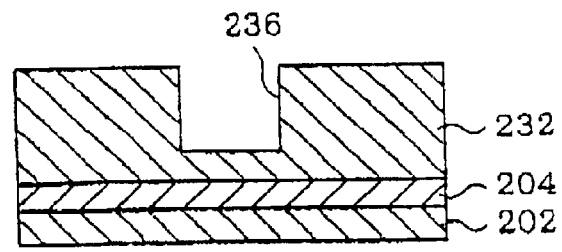
FIG. 3 is an explanatory view depicting another method of manufacturing a semiconductor capacitor, to which the present invention is applicable.

In the insulating film forming process, a silicon substrate 202 is heat-treated in the presence of oxygen, and a silicon oxide film 204 is formed over the surface of the silicon substrate 202 (see FIG. 3(a)). As shown in FIG. 4(c), such a silicon oxide film 204 has the function of insulating the silicon substrate 202 and the semiconductor capacitor 200 from each other. Incidentally, a processing temperature can be set to, for example, temperatures ranging from 800° C. to 1000° C. upon the heat treatment in the present process.

(2) Lower Electrode Forming Process

In the lower electrode forming process, a two-stage cylinder body 230 according to the present embodiment is formed over the silicon oxide film 204 as shown in FIG. 3(a) through FIG. 4(b). In the present process, a step for forming a conductive polysilicon film 232, which corresponds to a fifth step, a step for forming a second cylinder portion 240, which corresponds to a sixth step, and a step for forming a first cylinder portion 238, which corresponds to each of seventh to ninth steps, are successively executed.

(2-1) Step for Forming Conductive Polysilicon Film 232

In the forming step of the conductive polysilicon film 232, the conductive polysilicon film 232 is formed by, for example, reduced pressure CVD using a silane gas as shown in FIG. 3(a). Next, an impurity Is introduced into the conductive polysilicon film 232 to cause it to have conductivity. Next, the conductive polysilicon film 232 is patterned to form a concave portion 236. Incidentally, a reaction temperature for the reduced pressure CVD in the present step can be set to about 620° C., for example.

(2-2) Step for Forming Second Cylinder Portion 240

Figure 3B:
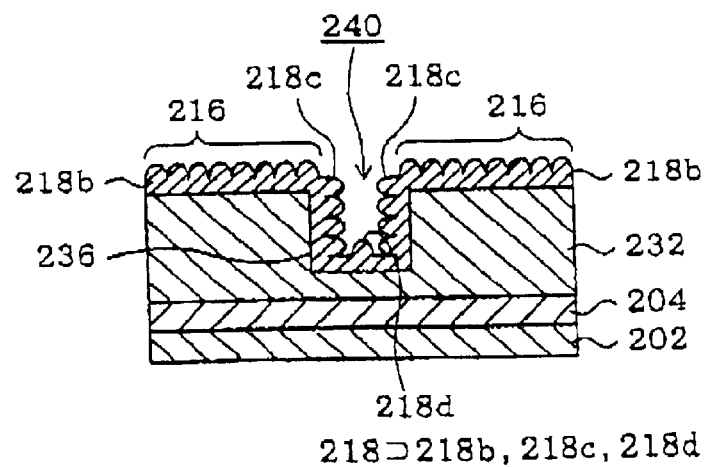

In the step for forming the second cylinder portion, a second portion 218b, a third portion 218c and a fourth portion 218d of a rough-surface polysilicon film 218 are formed through substantially the same process as the lower electrode forming process according to the first embodiment shown in FIG. 1 (a) through FIG. 2(a) (see FIG. 3(b)).

In the present step, a native oxide film is interposed all between the conductive polysilicon film 232 and the second portion 218b, between the conductive polysilicon film 232 and the third portion 218c and between the conductive polysilicon film 232 and the fourth portion 218d. Since the native oxide film has the function of separating the crystallizability of the conductive polysilicon film 232 and that of each portion of the rough-surface polysilicon film 218 from each other, projections and depressions 216 having forms stable in a manner similar to the projections and depressions 116 shown in FIG. 2(a) can be formed in the respective portions of the rough-surface polysilicon film 218.

As a result, the second cylinder portion 240 is formed within the concave portion 236.

(2-3) Step for Forming First Cylinder Portion 238

Figure 3C:
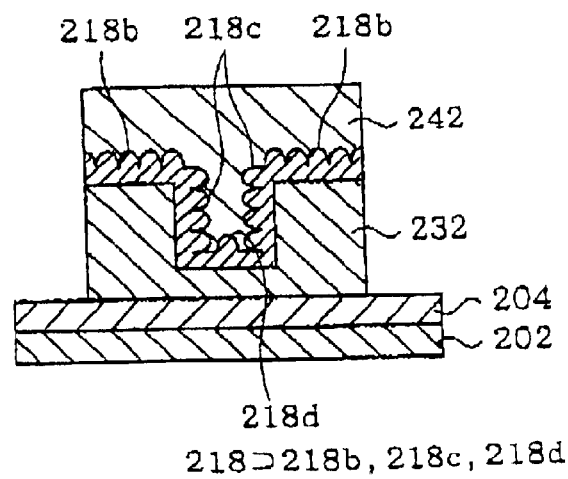

In the step for forming the first cylinder portion 238, a silicon oxide film 242 is first formed over the second portion 218b, the third portion 218c and the fourth portion 218d by CVD (see FIG. 3(c)). Next, the silicon oxide film 242 is subjected to patterning to thereby form a mask composed of the remaining silicon oxide film 242. Further, the rough-surface polysilicon film 218 (second portion 218b) and the conductive polysilicon film 232 are patterned using the mask, thereby forming a structure shown in FIG. 3(c). A portion for covering at least an aperture or opening of the second cylinder portion 240 is formed in the mask composed of the silicon oxide film 242 corresponding to a mask member.

Next, a first portion 218a, a fifth portion 218e and a subsequently-removed sixth portion 218f of the rough-surface polysilicon film 218 are formed through substantially the same process as the lower electrode forming process according to the first embodiment shown in FIG. 1(a) through FIG. 2(a) (see FIG. 4(a)). Next, a silicon oxide film 246 is formed over the entire surface of a wafer with the first portion 218a, the fifth portion 218e and the sixth portion 218f formed thereon by CVD and is further subjected to full-face anisotropic etching to thereby form a silicon oxide film 248 over the sides of the first portion 218a and the fifth portion 218e.

Next, the sixth portion 218f is etched with the silicon oxide film 248 as a mask to remove the remaining silicon oxide films 242 and 248 with a solution of hydrofluoric acid (see FIG. 4(b)). As a result, a two-stage cylinder body 230 is formed owing to the formation of the first cylinder portion 238. Since the first portion 218a through the fifth portion 218e of the rough-surface polysilicon film 218 constitutes a continuous film, they are not separated from one another in the process using the solution of hydrofluoric acid.

(3) Process for Forming Dielectric Film

In the dielectric film forming process, a silicon nitride film 220 used as an insulating film is deposited over the rough-surface polysilicon film 218 of the two-stage cylinder body 230 by reduced pressure CVD (see FIG. 4(c)). For example, a dichlorosilane gas and an ammonia gas can be used in the reduced pressure CVD in the present process. Further, the silicon nitride film 220 can be deposited thereon with a thickness of say about 50 angstroms.

(4) Upper Electrode Forming Process

In the forming process of the upper electrode, the silicon nitride film 220 is oxidized in wet oxygen at about 820° C., for example. Afterwards, polysilicon is first deposited over the silicon nitride film 220 by the reduced pressure CVD. Next, the polysilicon is caused to have conductivity by a predetermined impurity introducing method. Next, the polysilicon is subjected to patterning to thereby form a polysilicon film 222 (see FIG. 4(*c*)).

In the present embodiment as described above, the lower electrode takes a two-stage cylindrical form having steps thereinside. The surface thereof is covered with the rough-surface polysilicon film having substantially the same structure as that of the rough-surface polysilicon film according to the first embodiment. Thus, the semiconductor capacitor according to the present embodiment becomes broad in capacitor surface area and can hence make an increase in electric capacitance.

Further, in the present embodiment, the rough-surface polysilicon film having substantially the same structure as that of the rough-surface polysilicon film according to the first embodiment is used as the lower electrode. Thus, since the impurity introducing step is unnecessary, the surface area is also large and the impurity is injected into the film provided on each side, an electrode can be provided which prevents the occurrence of a depletion's problem when used as a capacitor electrode.

While the preferred embodiments according to the present invention have been described above, the present invention is not limited to such structures. It will be apparent to those skilled in the art that various modifications and changes can be supposed to be made to the invention within the scope of a technical idea described in the following claims. It is understood that these modifications and changes fall within the technical scope of the present invention.

Since the present invention does not necessarily require the introduction of an impurity into an electrode of a semiconductor capacitor, the possibility that once-formed irregular or uneven forms will be deformed, is low. Since projections and depressions provided on the surface of the electrode are formed under the influence of crystallizability of the surface of a lower film, the dependence on an in-electrode impurity concentration distribution indicated by the uneven forms on the surface of the electrode is reduced. In the present invention as well, a further improvement in electrode's surface area can be achieved owing to the use of a two-stage cylindrical form in the electrode. Thus, according to the present invention, a semiconductor capacitor can be provided which has a large and stable electric capacitance.

Further, the present invention does not necessarily require the introduction of an impurity into an electrode of a semiconductor capacitor. An electrode having projections and depressions formed on the surface thereof can be formed according to a step capable of implementing its formation within the same reactor. Thus, according to the present invention, a semiconductor device equipped with a semiconductor capacitor can achieve an improvement in yield by the prevention of particles, contamination, etc., the shortening of manufacturing time by a decrease in the number of manufacturing processes, and an improvement in throughput.

What is claimed is:

1. A method of manufacturing a semiconductor capacitor, comprising:
    forming an amorphous film composed of non-doped silicon;
    changing said amorphous film to a lower film having projections and depressions defined in the surface thereof by heat treatment;
    forming an amorphous film composed of impurity-doped silicon over the surface of the lower film; and
    changing said amorphous film composed of the impurity-doped silicon to an upper film having projections and depressions defined in the surface thereof by heat treatment with the projections and depressions provided over the surface of the lower film as a basis.

2. The method as claimed in claim 1, wherein said amorphous film composed of the non-doped silicon is formed by reduced pressure CVD.

3. The method as claimed in claim 2, wherein a reaction temperature for the reduced pressure CVD is set to within a temperature range in which the non-doped silicon transitions from non-crystalline to polycrystalline.

4. The method as claimed in any of claims 1, wherein said amorphous film composed of the impurity-doped silicon is formed by another reduced pressure CVD.

5. The method as claimed in claim 4, wherein a reaction temperature for another reduced pressure CVD is set to within a temperature range in which the impurity-doped silicon transitions from non-crystalline to polycrystalline.

6. The method as claimed in claim 1, wherein said amorphous film is comprised of non-doped silicon transformed from non-crystalline to polycrystalline by said heat treatment at a temperature range from 560° C. to 580° C.

7. The method as claimed in claim 6, wherein said heat treatment is conducted in a vacuum atmosphere.

8. A method of manufacturing a semiconductor capacitor, comprising:
    a process for forming a lower electrode of said semiconductor capacitor;
    said process including,
        forming a conductive polysilicon film having a concave portion defined in an exposed surface thereof;
        forming a rough-surface polysilicon film over an area including the concave portion over the exposed surface to thereby form one cylinder portion within the concave portion;
        forming a mask material including a portion for covering said one cylinder portion over the rough-surface polysilicon film;
        forming another rough-surface polysilicon film which forms a film continuous with said rough-surface polysilicon film, over an exposed surface of the mask material; and
        removing part of said another rough-surface polysilicon film and the mask material to thereby form another cylinder portion over the removal portion of the mask material.

* * * * *